(12) United States Patent
Sato et al.

(10) Patent No.: US 6,301,678 B1
(45) Date of Patent: Oct. 9, 2001

(54) TEST CIRCUIT FOR REDUCING TEST TIME IN SEMICONDUCTOR MEMORY DEVICE HAVING MULTIPLE DATA INPUT/OUTPUT TERMINALS

(75) Inventors: Hirotoshi Sato; Tomohisa Wada; Shigeki Ohbayashi, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/167,713

(22) Filed: Oct. 7, 1998

(30) Foreign Application Priority Data

May 6, 1998 (JP) .................................... 10-123256

(51) Int. Cl.[7] .................................................. G11C 29/00
(52) U.S. Cl. .......................................... 714/718; 714/733
(58) Field of Search ........................... 365/233; 714/718, 714/733; 711/5; 257/48, 734

(56) References Cited

U.S. PATENT DOCUMENTS

| | | | | |
|---|---|---|---|---|
| 5,600,606 | * | 2/1997 | Rao ........................ | 365/233 |
| 5,925,141 | * | 7/1999 | Ariki ....................... | 714/718 |
| 5,950,219 | * | 9/1999 | Rao ......................... | 711/5 |
| 5,965,902 | * | 10/1999 | Beffa ...................... | 257/48 |
| 5,998,869 | * | 12/1999 | Lin et al. ................. | 257/734 |

FOREIGN PATENT DOCUMENTS

| | | |
|---|---|---|
| 04-307751 | 10/1992 | (JP) . |
| 06-208800 | 7/1994 | (JP) . |
| 09-091998 | 4/1997 | (JP) . |

* cited by examiner

*Primary Examiner*—Albert Decady
*Assistant Examiner*—David Ton
(74) *Attorney, Agent, or Firm*—McDermott, Will & Emery

(57) ABSTRACT

In a semiconductor memory device having a plurality of data input/output pins, control pins (e.g. address pins and external control signal pins) are arranged parallel to each other on a chip. The plurality of data input/output pins are divided into a plurality of groups. Each group has a specific data input/output pin. The specific data input/output pin is lined up with the control pins. In a test mode, a signal is written into all memory cells by applying the signal to the specific data input/output pin. In addition, whether the signals read from all memory cells are correct or not is determined using the specific data input/output pin.

15 Claims, 11 Drawing Sheets

TEST CIRCUIT FOR REDUCING TEST TIME IN SEMICONDUCTOR MEMORY DEVICE HAVING MULTIPLE DATA INPUT/OUTPUT TERMINALS

BACKGROUND OF THE INVENTION

1. Field of the Invention

The present invention relates to a semiconductor memory device, and more particularly to a configuration for reducing a test time required in a semiconductor memory device having a plurality of data input/output terminals.

2. Description of the Background Art

FIG. 11 shows a pin arrangement in a conventional semiconductor memory device 9000. In FIG. 11, a reference character Q represents a pin. Each of pins Q represents an address pin, a data pin, a control signal pin, or one of a plurality of data I/O pins.

In a semiconductor memory device (especially SRAM as semiconductor memory device 9000, all data input/output pins must be used in order to test its internal operation. If there is 36 data input/output pins, for example, data must be written into and read out from all of 36 data input/output pins and signals output from corresponding pads must be measured.

Especially when the number of I/O pins increases, as signal application and output measurement is required for all I/O pins, the configuration of a testing apparatus (probe) becomes complicated. In addition, with a large number of I/O pins, the number of chips (semiconductor memory devices) which can be measured at one time is limited. Thus, a simultaneous testing of a large number of chips is not allowed, which leads to a long test time and a large test cost.

SUMMARY OF THE INVENTION

The present invention provides a semiconductor memory device allowing reduced test time and test cost saving by simplifying a test.

In one aspect of the present invention, a semiconductor memory device includes a plurality of data input/output pins; a plurality of memory cells transmitting and receiving a signal to and from a respective one of the plurality of data input/output pins; a plurality of control pins receiving a signal controlling an internal operation; a test signal generation circuit responsive to a signal supplied from the plurality of control pins, detecting a specific test mode and generating a corresponding test signal; and a test circuit responsive to a signal supplied as an input from a specific data input/output pin among the plurality of data input/output pins, testing operations of the plurality of memory cells based on the test signal, and externally providing as an output a test result from the specific data input/output pin, wherein the specific data input/output pin is lined up with the plurality of control pins.

One advantage of the present invention is that even in a semiconductor memory device having a large number of data input/output pins, a memory cell operation test can be conducted using a small number of specific data input/output pins (i.e. reduced I/O pin). Particularly lined up arrangement (collective arrangement) of the control pins and the specific data input/output pin simplifies signal application, and hence allows the operation test for all memory cells without necessitating a complicated testing apparatus. In addition, adjacent chips on a wafer can be tested at one time. Thus time and cost required for a test can be reduced.

Particularly, the memory cell operation test is readily allowed using a specific data input/output pin lined up with control pins no matter on which side the plurality of data input/output pins are arranged.

Further, the memory cell operation test is readily allowed, particularly by lining the specific data input/output pins with lines of control pins arranged in parallel, regardless of the position in which the plurality of data input/output pins are arranged.

More particularly, the specific data input/output pin is arranged at the end of the line of control pins. Hence, simple test signal input and test result measurement are allowed in a test mode (i.e. I/O reduction mode).

Particularly in the test mode (I/O reduction mode), a signal on the specific data input/output pin is used instead of the signals on all data input/output pins. Therefore signal input to all data input/output pins is not necessary. In addition, in the test mode a signal, which indicates a state of the memory cell, is provided from the specific data input/output pin as an output. Therefore the test can be conducted using the specific data input/output pin alone.

Even in a semiconductor memory device having a continuous multi bit write/erase function, reduced test time and test cost can be achieved as well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
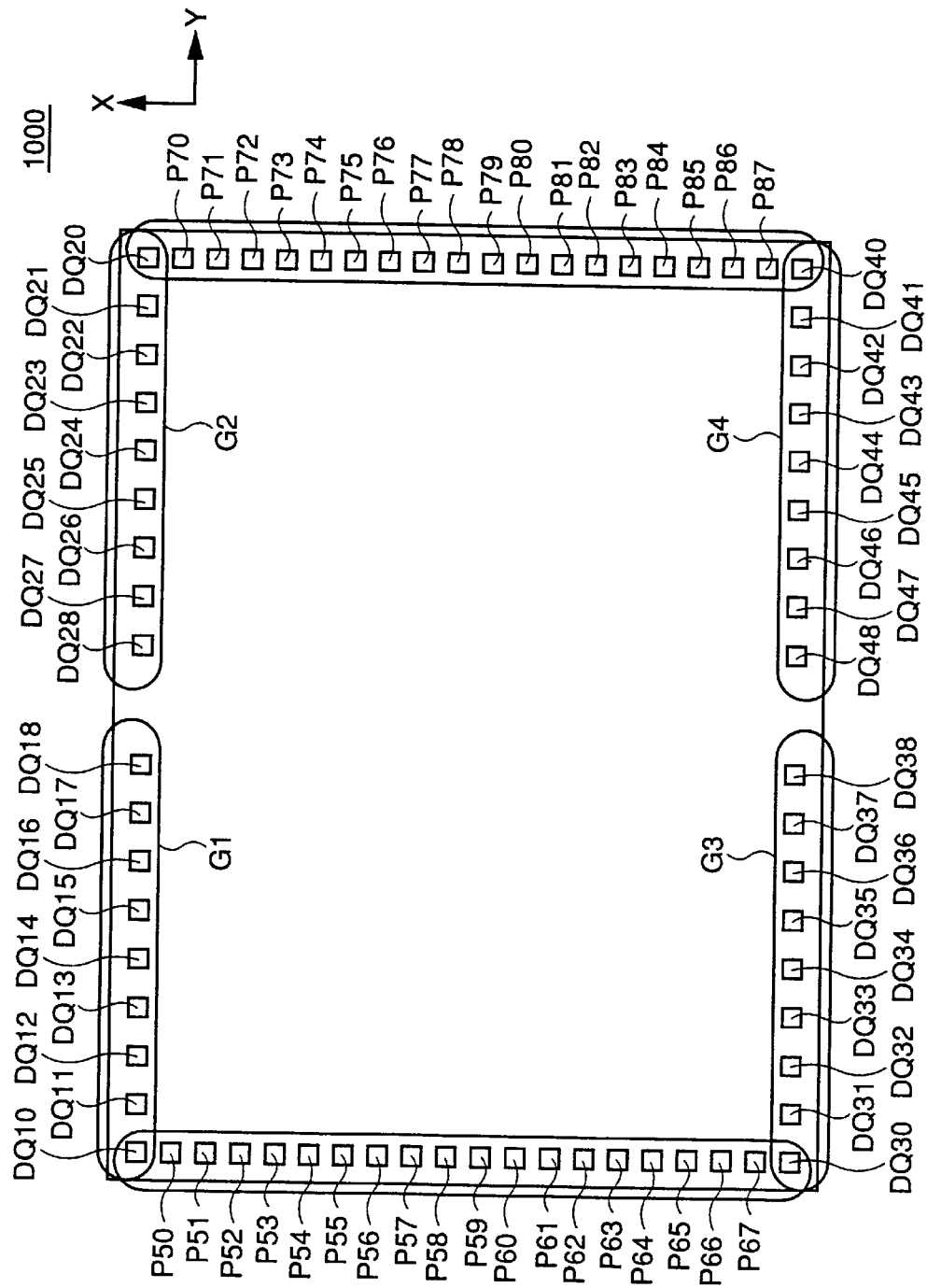
FIG. 1 shows a pin arrangement in a semiconductor memory device 1000 in accordance with a first embodiment of the present invention.

Referring to FIG. 1, the semiconductor memory device in accordance with the first embodiment of the present invention will be described.

Semiconductor memory device 1000 shown in FIG. 1 includes a plurality of data input/output pins transmitting and receiving a signal to and from internal memory cells and a plurality of control pins receiving a signal for controlling an internal operation.

In FIG. 1, as an example of data input/output pins, 36 pins in total including data input/output pins DQ10–DQ18, data input/output pins DQ20–DQ28, data input/output pins DQ30–DQ38 and data input/output pins DQ40–DQ48, are shown. In addition, control pins P50–P67 and P70–P87 are shown as an example of the control pins. Each control pin receives a control signal (such as an external row address strobe signal /RAS and an external column strobe signal /CAS), an address signal, an operational power supply voltage and the like.

The plurality of data input/output pins are divided into a plurality of groups. Hereinafter, a group consisting of data input/output pins DQ10–DQ18 is referred to as group G1, a group of data input/output pins DQ20–DQ28 as group G2, a group of data input/output pins DQ30–DQ38 as group G3, and a group of data input/output pins DQ40–DQ48 as group G4.

In semiconductor memory device 1000 shown in FIG. 1, the data input/output pins of groups G1 and G2 are arranged along one long side (Y axis shown in FIG. 1).

Along the opposing long side, the data input/output pins of groups G3 and G4 are arranged.

On two opposing short sides (X axis shown in FIG. 1), the control pins P50–P67 and the control pins P70–P87 are arranged, respectively.

The data input/output pin DQ10 in group G1 and the data input/output pin DQ30 in group G3 are lined up with the control pins P50–P67.

The data input/output pin DQ20 in group G2 and the data input/output pin DQ40 in group G4 are lined up with the control pins P70–P87.

Semiconductor memory device 1000 in accordance with the first embodiment of the present invention allows the operation test of all memory cells arranged therein, by applying a signal only to the control pins and pins (data input/output pins DQ10, DQ20, DQ30 and DQ40) lined up with the control pins.

Hereinafter for simplicity, the data input/output pins receiving signals as an input in the test mode are referred to as reduced I/O pins (DQ10, DQ20, DQ30 and DQ40), and other data input/output pins are referred to as to-be-reduced I/O pins.

Figure 2:
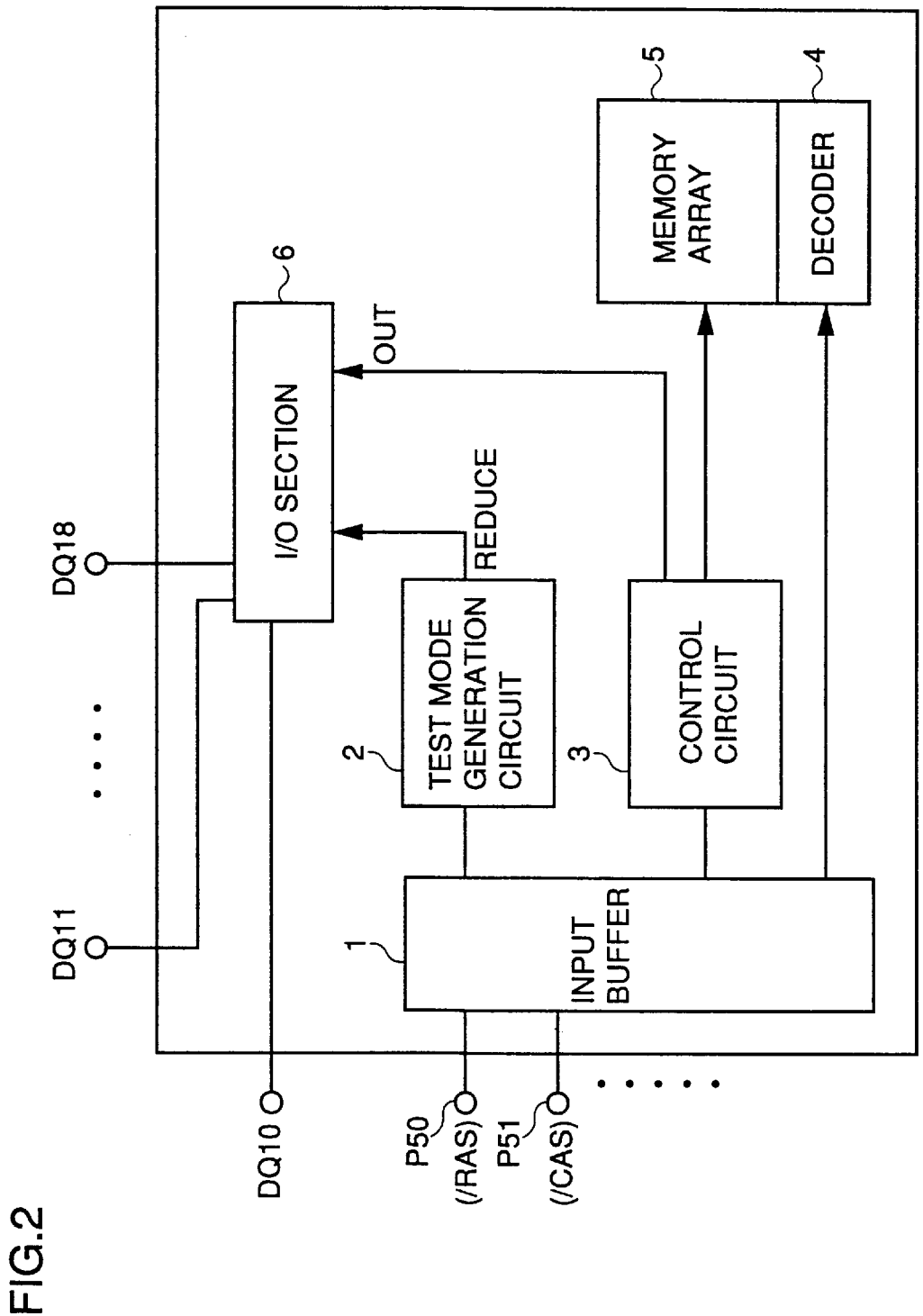
FIG. 2 is a schematic block diagram showing an example of the overall configuration of semiconductor memory device 1000 in accordance with the first embodiment of the present invention.

With reference to FIG. 2, the overall configuration of semiconductor memory device 1000 shown in FIG. 1 will be described. In FIG. 2, the data input/output pins of group G1 are shown as a representative.

As shown in FIG. 2, semiconductor memory device 1000 includes an input buffer 1, a test mode generation circuit 2, a control circuit 3, a decoder 4, a memory cell array 5, and an input/output section 6.

Memory cell array 5 includes a plurality of memory cells arranged in a matrix. Input buffer 1 receives a control signal, an address signal and the like from control pins P50, . . . and provides a corresponding signal as an output. In response to the address signal received from the control pin, decoder 4 selects a corresponding memory cell.

Control circuit 3 generates a signal which designates an internal operation (e.g. a read operation and a write operation). Test mode generation circuit 2 generates a test signal designating an operation test for the internal circuitry. In the first embodiment of the present invention, test mode generation circuit 2, responsive to a specific signal received from the control pin, detects the I/O reduction mode for testing a state of storage of memory cell array 5, to output a corresponding I/O reduction mode designating signal REDUCE.

I/O section 6 includes I/O units corresponding to the respective groups as described below. At the writing operation in a normal mode, I/O section 6 performs a process for transmitting a signal received from each data input/output pin to a corresponding memory cell, and at the reading operation, a process for transmitting a signal read from a memory cell to a corresponding data input/output pin.

On the other hand, on receiving the I/O reduction mode designating signal REDUCE, I/O section 6 performs a process for testing a memory cell operation using a signal received from a reduced I/O pin (a specific data input/output pin, e.g. data input/output pin DQ10) instead of a signal received from each one of data input/output pins and for providing a test result as an output from the reduced I/O pin (hereinafter, a mode in which the I/O reduction mode designating signal REDUCE is in an active state, is referred to as I/O reduction mode).

Next, the I/O unit corresponding to each group shown in FIGS. 1 and 2 will be described referring to FIG. 3.

Figure 3:
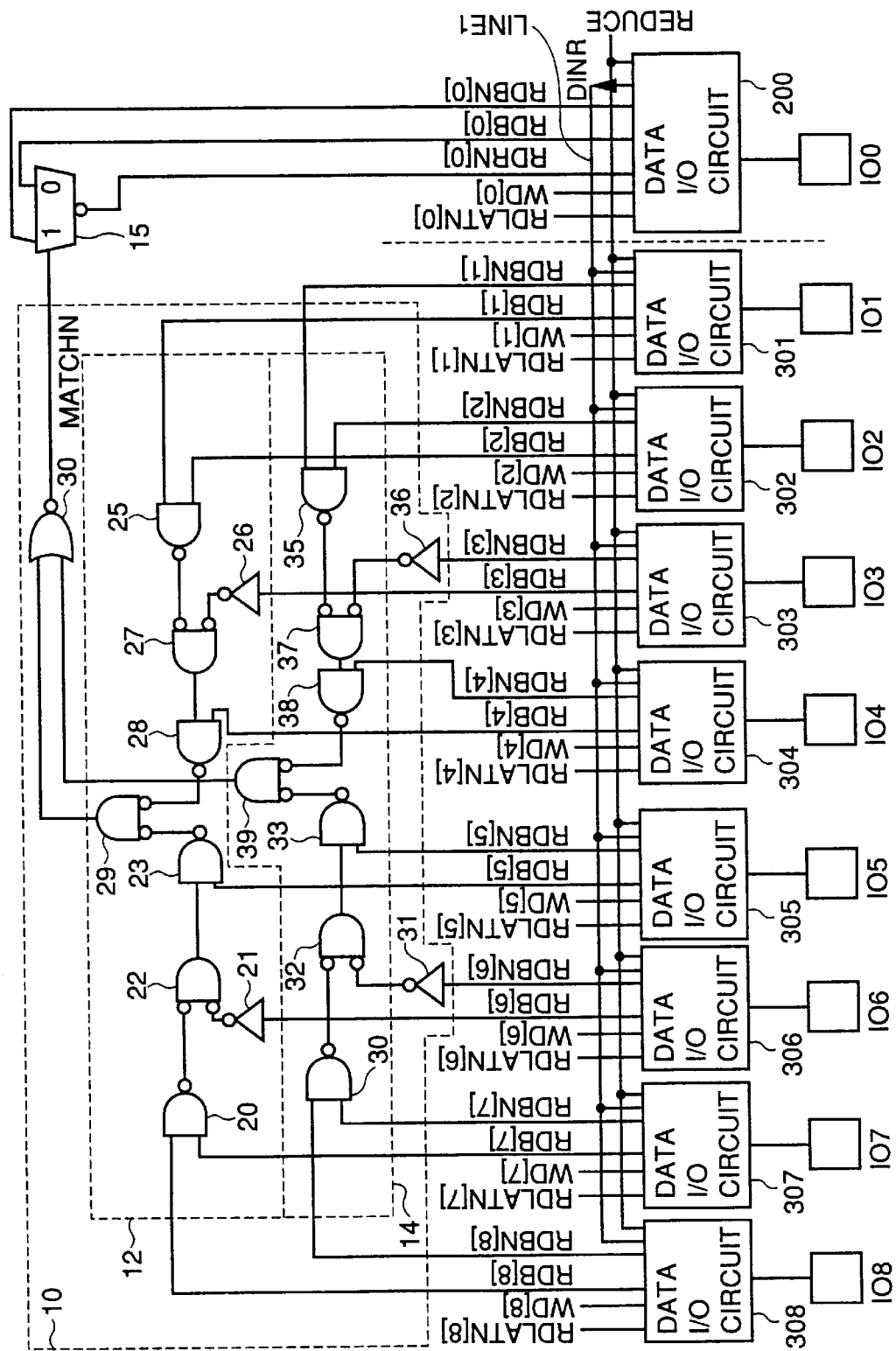
FIG. 3 shows an internal configuration of a main section of semiconductor memory device 1000 in accordance with the first embodiment of the present invention.

An I/O unit arranged for pads 100–108 is shown in FIG. 3.

In FIG. 3, pad 100 corresponds to the reduced I/O pin DQ10 (or DQ20, DQ30, DQ40) shown in FIG. 1, and pads 101–108 correspond to the to-be-reduced I/O pins DQ11–DQ18 (or DQ21–DQ28, DQ31–DQ38, DQ41–DQ48) included in the same group as pad 100, respectively.

As shown in FIG. 3, semiconductor memory device 1000 includes data input/output circuits 200 and 301–308, a data comparison circuit 10 and a multiplexer 15.

Data input/output circuit 200 is arranged for pad 100. Data input/output circuits 301–308 are arranged respectively for pads 101–108.

At the writing operation in the normal mode, respective data input/output circuits 200, 301–308, in response to signals received from corresponding pads, supply corresponding signals to corresponding write buses WD(0), and WD(1)–WD(8) as an output. The signals received by the write buses WD(0), and WD(1)–WD(8) are transmitted to memory cells not shown.

At the writing operation in the I/O reduction mode, data input/output circuit 200 supplies, in response to a signal from corresponding pad 100, a corresponding signal to a corresponding write bus WD(0), as well as a corresponding signal DINR to a signal line LINE1 as outputs. In response to the I/O reduction mode designating signal REDUCE, each one of data input/output circuits 301–308, instead of a corresponding pad, receives the signal DINR from the signal LINE1, and supplies the signal as an output to a corresponding write bus.

At the reading operation in the normal mode, respective data input/output circuits 200, and 301–308 receive signals read from memory cells not shown via corresponding read buses RDLATN(0), and RDLATN(1)–RDLATN(8) and supply corresponding signals to corresponding pads as outputs.

At the reading operation in the I/O reduction mode, respective data input/output circuits 200, and 301–308 supply signals on the corresponding read buses RDLATN(0)–RDLATN(8) to the corresponding test read buses RDB(0) and RDBN(0)–RDB(8) and RDBN(8) as outputs.

Herein, each pair of the test read buses RDB(0) and RDBN(0) to RDB(8) and RDBN(8) are in a complementary relationship, that is when one is at a logical high level (H level), the other is at a logical low level (L level).

Data comparison circuit 10 is arranged for the test read buses RDB(1)–RDB(8) and RDBN(1)–RDBN(8), as shown in FIG. 3.

Data comparison circuit 10 receives and compares signals from the plurality of corresponding test read buses, and outputs a determination signal MATCHN as a result of comparison. Multiplexer 15 supplies as an output to a read bus RDRN(0), in response to the determination signal MATCHN supplied as an output from data comparison circuit 10, either one of signals on the test read bus RDB(0) and on RDBN(0). Data input/output circuit 300 outputs a corresponding signal to pad 100, in response to a signal received from the read bus RDRN(0).

Next, a configuration of data comparison circuit 10 shown in FIG. 3 will be described. When signals on the test read buses RDB(1)–RDB(8) and RDBN(1)–RDBN(8) all match, data comparison circuit 10 supplies as an output the determination signal MATCHN at an active state of an L level, and in other cases supplies as an output the determination signal MATCHN at an H level.

Data comparison circuit 10 includes detection circuits 12 and 14 and an NOR circuit 30.

Detection circuit 12 will now be described. Detection circuit 12 detects match/mismatch of signals on the test read buses RDB(1)–RDB(8).

Detection circuit 12 includes NAND circuits 20 and 23, an inverter circuit 21 and a negative logic NOR circuit 22.

NAND circuit 20 receives signals from the test read buses RDB(7) and RDB(8). Inverter circuit 21 inverts a signal from the test read bus RDB(6) and outputs the resulting signal. Negative logic NOR circuit 22, receiving outputs from NAND circuit 20 and inverter circuit 21 as inputs, supplies an H level signal as an output when both of these signals are at an L level, and otherwise supplies an L level signal as an output. NAND circuit 23 receives as inputs an output from negative logic NOR circuit 22 and a signal from the test read bus RDB(5).

Detection circuit 12 further includes NAND circuits 25 and 28, an inverter circuit 26 and negative logic NOR circuits 27 and 29.

NAND circuit 25 receives signals from the test read bus RDB(1) and RDB(2). Inverter circuit 26, receiving a signal from the test read bus RDB(3), supplies as an output an inverted version thereof. Negative logic NOR circuit 27, receiving outputs from NAND circuit 25 and inverter circuit 26, supplies an H level signal as an output when both of these signals are at an L level, and otherwise supplies an L level signal as an output. NAND circuit 28 receives as an input an output from negative logic NOR circuit 27 and a signal from the test read bus RDB(4). Negative logic NOR circuit 29 receives outputs from NAND circuit 23 and NAND circuit 28 at its inputs, and supplies as an output an H level signal when both of these signals are at an L level and otherwise an L level signal.

Following is the description of detection circuit 14. Detection circuit 14 detects match/mismatch of signals on the test read buses RDBN(1)–RDBN(8).

Detection circuit 14 includes NAND circuits 30 and 33, an inverter circuit 31 and a negative logic NOR circuit 32.

NAND circuit 30 receives signals from the test read buses RDBN(7) and RDBN(8). Inverter circuits 31 inverts a signal from the test read bus RDBN(6) as an input and outputs the resulting signal. Negative logic NOR circuit 32, receiving outputs from NAND circuit 30 and inverter circuit 31 at its inputs, supplies an H level signal when both of these signals are at an L level, and otherwise supplies an L level signal as an output. NAND circuit 33 receives at its inputs an output from negative logic NOR circuit 32 and a signal from the test read bus RDBN(5).

Detection circuit 14 further includes NAND circuits 35 and 38, an inverter circuit 36 and negative logic NOR circuits 37 and 39.

NAND circuit 35 receives signals from the test read buses RDBN(1) and RDBN(2). Inverter circuit 36 inverts a signal from the test read bus RDBN(3) and outputs the result. Negative logic NOR circuit 37, receiving outputs from NAND circuit 35 and inverter circuit 36 at its inputs, supplies as an output an H level signal when both of these signals are at an L level, and otherwise an L level signal. NAND circuit 38 receives an output of negative logic NOR circuit 37 and a signal from the test read bus RDBN(4) at its inputs. Negative logic NOR circuit 39 receives outputs from NAND circuit 33 and NAND circuit 38 as inputs, and supplies as an output an H level signal when both of these signals are at an L level, and otherwise supplies an L level signal.

NOR circuit 30 receives signals from negative logic NOR circuits 29 and 39 and supplies as an output the determination signal MATCHN.

When the determination signal MATCHN is at an active state of an L level, multiplexer 15 supplies a signal from the test read bus RDB(0) to the read bus RDRN(0) as an output. When the determination signal MATCHN is at an inactive state of an H level, the multiplexer provides a signal from the test read bus RDBN(0) to the read bus RDRN(0) as an output.

When the I/O reduction mode designating signal REDUCE is at an active state of an H level (I/O reduction mode), data input/output circuit 200 provides a signal received from the read bus RDRN(0) to the corresponding pad 100 as an output.

By this configuration, in the writing operation, a signal (expected value) can be supplied as an input to the I/O unit corresponding to all the to-be-reduced I/O pins which belong to the same group, using the reduced I/O pin. In addition, in the reading operation, when all of the read signals are determined to be the same with the expected value as a result of read signal comparison, the expected value can be supplied as an output from the reduced I/O pin, and otherwise an inverted signal of the expected value can be supplied as an output from the reduced I/O pin.

A configuration of data input/output circuit 200 corresponding to the reduced I/O pin in accordance with the first embodiment of the present invention will be described referring to FIG. 4.

Figure 4:
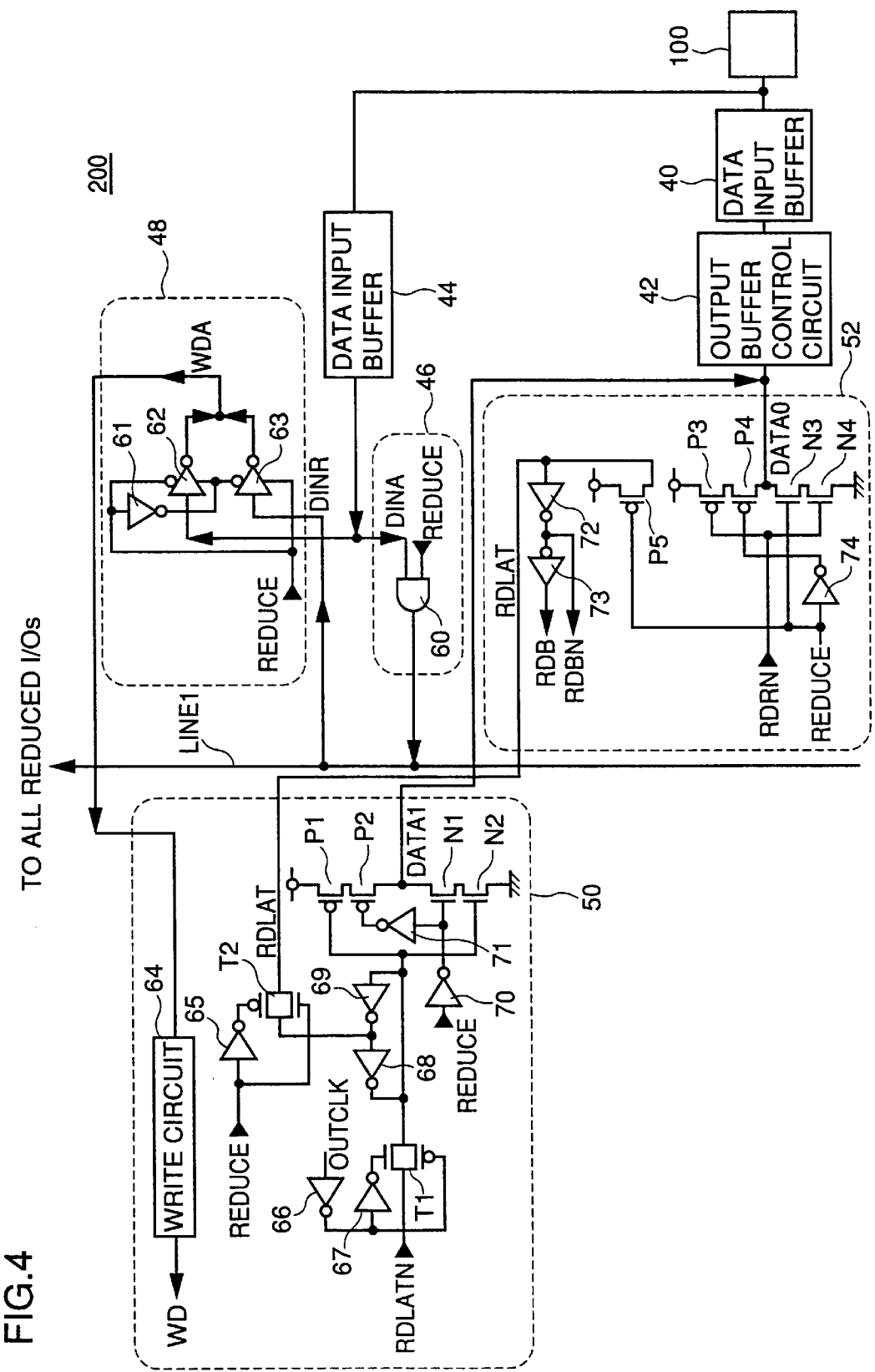
FIG. 4 is a circuit diagram showing an example of a specific configuration of a data input/output circuit 200 corresponding to a reduced I/O pin in accordance with the first embodiment of the present invention.

As can be seen from FIG. 4, data input/output circuit 200 includes a data output buffer 40, an output buffer control circuit 42, a data input buffer 44, a reduction input circuit 46, a write bus switching circuit 48, a memory cell peripheral circuitry 50 and a reduction signal generation circuit 52.

Data input buffer 44 receives a signal output from pad 100 and supplies a corresponding signal DINA as an output. The signal DINA is transmitted to write bus switching circuit 48 and reduction input circuit 46.

Reduction input circuit 46 includes an AND circuit 60. The I/O reduction mode designating signal REDUCE and the signal DINA output from data input buffer 44 are supplied as inputs to AND circuit 60 which outputs the signal DINR. When the I/O reduction mode designating signal REDUCE is in an active state of an H level (I/O reduction mode), the signal DINR is in phase with the signal DINA, and when the I/O reduction mode designating signal REDUCE is at an inactive state of an L level (mode other than the I/O reduction mode), the signal DINR is in an L level.

The signal DINR is transmitted to I/O circuits (data input/output circuits 301–308 shown in FIG. 2) corresponding to the to-be-reduced I/O pins via the signal line LINE1.

Write bus switching circuit 48 will be described. In response to the I/O reduction mode designating signal REDUCE, write bus switching circuit 48 supplies as an output signal WDA, either the signal DINA from data input buffer 44 or the signal DINR from reduction input circuit 46 to memory cell peripheral circuitry 50 described below.

Write bus switching circuit 48 includes an inverter circuit 61 and gate circuits 62 and 63. The I/O reduction mode designating signal REDUCE is supplied as an input to inverter circuit 61 which outputs an inverted REDUCE signal.

Gate circuit 62 receives the signal DINA at its input. Gate circuit 63 receives the signal DINR at its input. In response to the I/O reduction mode designating signal REDUCE, gate circuit 62 inverts an input signal and outputs the resulting signal. In response to the inverted I/O reduction mode designating signal REDUCE, gate circuit 63 inverts an input signal and outputs the resulting signal.

Specifically, gate circuit 63 outputs a signal opposite in phase with the signal DINR when the I/O reduction mode designating signal REDUCE is at an H level. Gate circuit 62 outputs a signal opposite in phase with the signal DINA when the I/O reduction mode designating signal REDUCE is at an L level.

An output signal (WDA signal) from either gate circuit 62 or 63 is applied to memory cell peripheral circuitry 50.

Specifically, a signal applied to a memory cell is, the signal DINR in the I/O reduction mode and the signal DINA in the other mode.

Next, memory cell peripheral circuitry 50 will be described. Memory cell peripheral circuitry 50 includes a write circuit 64. Write circuit 64 receives the signal WDA from write bus switching circuit 48 and supplies a corresponding signal to a corresponding write bus as an output. Herein the write bus corresponds to the write bus WD(0) shown in FIG. 3.

Memory cell peripheral circuitry 50 further includes inverter circuits 66 and 67, a transfer gate T1 and inverter circuits 68 and 69. Inverter circuit 66 receives a control signal OUTCLK for the reading operation. The control signal OUTCLK consists of a pulse train especially when it is used in a synchronous semiconductor memory device. Inverter circuit 66 inverts the control signal OUTCLK and outputs the resulting signal. Inverter circuit 67 supplies as an output an inverted version of the signal supplied from inverter circuit 66.

In response to each output signal supplied from inverter circuits 66 and 67, the transfer gate T1 outputs a corresponding signal to a latch circuit described below, based on the signal RDLATN on a corresponding read bus. Herein the read bus corresponds to the read bus RDLATN(0) shown in FIG. 3.

Specifically, the transfer gate T1 is rendered conductive by the control signal OUTCLK of an H level and outputs a corresponding signal. When the control signal OUTCLK is at an L level, the transfer gate T1 is rendered nonconductive and thus stops signal output.

Inverter circuits 68 and 69 constitute a latch circuit which latches an output signal from the transfer gate T1.

Memory cell peripheral circuitry 50 further includes an inverter circuit 65 and a transfer gate T2. The output of inverter circuit 65 is an inverted version of the I/O reduction mode designating signal REDUCE. In response to the I/O reduction mode designating signal REDUCE and based on the output signal of inverter circuit 69, the transfer gate T2 outputs a corresponding signal RDLAT.

Specifically, the transfer gate T2 is rendered conductive in response to the I/O reduction mode designating signal REDUCE of an H level, to output the signal RDLAT opposite in phase with the signal RDLATN. The transfer gate T2 is rendered nonconductive in response to the control signal OUTCLK at an L level.

Memory cell peripheral circuitry. 50 further includes inverter circuits 70 and 71, PMOS transistors P1 and P2, and NMOS transistors N1 and N2. Inverter circuit 70 inverts the I/O reduction mode designating signal REDUCE and supplies the result as an output. The output signal of inverter circuit 70 is supplied as an input to inverter circuit 71 which inverts the signal and outputs the resulting signal.

PMOS transistors P1 and P2 and NMOS transistors N1 and N2 are connected in series between a power supply potential and a ground potential. From a connect node of PMOS transistor P2 and NMOS transistor N1, a signal DATA1 is supplied as an output. NMOS transistor N2 and PMOS transistor P1 each receive a signal from the latch circuit including inverter circuits 68 and 69. An output signal from inverter circuit 71 is applied to a gate electrode of PMOS transistor P2. An output signal from inverter circuit 70 is applied to a gate electrode of NMOS transistor N1.

When the I/O reduction mode designating signal REDUCE is at an H level, PMOS transistor P2 and NMOS transistor N1 are rendered nonconductive.

On the other hand, when the I/O reduction mode designating signal REDUCE is at an L level, NMOS transistor N1 and PMOS transistor P2 are rendered conductive. In this case the signal DATA1 changes its state in accordance with the conductive/nonconductive state of NMOS transistor N2 or PMOS transistor P1.

More specifically, in the I/O reduction mode, the signal RDLAT, which is an inverted version of the signal RDLATN, is supplied as an output. In the other mode, the signal DATA1 is supplied as an output in response to the signal RDLATN.

Reduction signal generation circuit 52 will be described. Reduction signal generation circuit 52 supplies an input signal to multiplexer 15 shown in FIG. 3 and outputs a signal DATA0 in response to a signal received from multiplexer 15. Reduction signal generation circuit 52 includes inverter circuits 72 and 73 and a PMOS transistor P5.

Inverter circuit 72 inverts the output signal RDLAT from memory cell peripheral circuitry 50 and outputs the resulting signal. The output signal from inverter circuit 72 is applied to inverter circuit 73 which inverts the signal and outputs the result. The outputs of inverter circuits 72 and 73 are in a complementary relation. Inverter circuit 73 applies the signal RDB to a corresponding test read bus (the test read bus RDB(0) in FIG. 3). Inverter circuit 72 supplies the signal RDBN to a corresponding test read bus (the test read bus RDBN(0) in FIG. 3).

Each of signals RDB and RDBN is transmitted to multiplexer 15. PMOS transistor P5 is connected between the power supply potential and an input node of inverter circuit 72. The I/O reduction mode designating signal REDUCE is applied to a gate electrode of PMOS transistor P5.

When the I/O reduction mode designating signal REDUCE is at an H level, PMOS transistor P5 is at a nonconductive state, and thus the input node of inverter circuit 72 (i.e. the signal RDLAT) does not change. When the I/O reduction mode designating signal REDUCE turns to an L level, PMOS transistor P5 is rendered conductive, and thus the signal RDLAT is forcefully turned to an H level.

Reduction signal generation circuit 52 further includes PMOS transistors P3 and P4, NMOS transistors N3 and N4 and an inverter circuit 74.

Inverter circuit 74 inverts the I/O reduction mode designating signal REDUCE and supplies the resulting signal as an output.

PMOS transistors P3 and P4 and NMOS transistors N3 and N4 are connected in series between the power supply potential and the ground potential. An output signal from inverter circuit 74 is applied to a gate electrode of PMOS transistor P4. The I/O reduction mode designating signal REDUCE is applied to a gate electrode of NMOS transistor N3. The gate electrodes of PMOS transistor P3 and NMOS transistor N4 each receive the signal RDRN from a corresponding read bus. Herein the read bus corresponds to the read bus RDRN(0) shown in FIG. 3.

When the I/O reduction mode designating signal REDUCE is at an H level, PMOS transistor P4 and NMOS transistor N3 are rendered conductive. Then in response to the signal RDRN, the signal DATA0 is supplied as an output from a connect node between PMOS transistor P4 and NMOS transistor N3.

When the I/O reduction mode designating signal REDUCE is at an L level, PMOS transistor P4 and NMOS transistor N3 are rendered nonconductive.

Output buffer 42 receives either the signal RDLAT output from memory cell peripheral circuitry 50 or the signal DATA0 output from reduction signal generation circuit 52, and outputs a corresponding signal to data output buffer 40. Data output buffer 40 transmits a signal corresponding to an input signal to the corresponding pad 100.

Referring to FIG. 4, an operation of data input/output circuit 200 will be described. In the I/O reduction mode (that is, when the I/O reduction mode designating signal REDUCE is at an H level), in response to an input signal from pad 100, reduction input circuit 46 outputs the signal DINR in phase with the input signal. The signal DINR is transmitted to a corresponding write bus via write bus switching circuit 48 and write circuit 64 as well as to data input/output circuits belonging to the same group.

Memory cell peripheral circuitry 50 receives the signal RDLATN read from a memory cell. When the signal RDLATN is at an H level, the signal RDLAT of an L level is generated, and when the signal RDLATN is at an L level, the signal RDLAT of an H level is generated.

Reduction signal generation circuit 52 supplies as an output the signal RDB in phase with the signal RDLAT and the signal RDBN opposite in phase with the signal RDLAT. As described above, the signal RDRN is in phase with the signal RDB, when an L level determination signal MATCHN is generated. When the determination signal MATCHN is at an H level, the signal RDRN is in phase with the signal RDBN.

In the I/O reduction mode, reduction signal generation circuit 52 outputs the signal DATA0 opposite in phase with the signal RDRN.

Next with reference to FIG. 5, a configuration of data input/output circuits 301–308 shown in FIG. 3 will be described.

A data input/output circuit shown in FIG. 5 (hereinafter referred to as a data input/output circuit 300) includes a data output buffer 40, an output buffer control circuit 42, a data input buffer 44, a write bus switching circuit 48, a memory cell peripheral circuitry 50 and a reduction signal generation circuit 54. The same components with those included in data input/output circuit 200 shown in FIG. 4 are designated by the same reference characters and numbers and the description thereof will not be repeated. A pad 311 shown in FIG. 5 corresponds to one of pads 101–108 shown in FIG. 3.

Write bus switching circuit 48 provides as an output signal WDA, either the signal DINR received from the signal line LINE1 or the signal DINA received from data input/output buffer 44. Write circuit 64 included in memory cell peripheral circuitry 50 receives and provides the signal WDA to a corresponding write bus. Herein, the write bus corresponds to one of write buses WD(1)–WD(8) shown in FIG. 3.

Memory cell peripheral circuitry 50 supplies as an output, in response to the signal RDLATN received from a read bus, the signal RDLAT or the signal DATA1. Herein the read bus corresponds to either one of read buses RDLATN(1)–RDLATN(8) shown in FIG. 3.

Reduction signal generation circuit 54 will be described. Reduction signal generation circuit 54 includes inverter circuits 82 and 83 and a PMOS transistor P8. Inverter circuit 82 receives the output signal RDLAT from memory cell peripheral circuitry 50 and supplies an inverted version (the signal RDBN) of this signal as an output. The output of inverter circuit 83 is an inverted version (the signal RDB) of the output signal from inverter circuit 82. The output signals of inverter circuit 82 and inverter circuit 83 are in a complementary relation.

Inverter circuit 83 provides the signal RDB to a corresponding test read bus (one of the test read buses RDB(1)–(8) in FIG. 3). Inverter circuit 72 provides the signal RDBN to a corresponding test read bus (one of the test read buses RDBN(1)–(8) in FIG. 3).

PMOS transistor P8 is connected between the power supply potential and an input node of inverter circuit 82. A gate electrode of PMOS transistor P8 receives the I/O reduction mode designating signal REDUCE.

When the I/O reduction mode designating signal REDUCE is at an H level, PMOS transistor P8 is at a nonconductive state, therefore the input node of inverter circuit 82 (that is, the signal RDLAT) does not change. On the other hand, when the I/O reduction mode designating signal REDUCE is at an L level, PMOS transistor P8 is rendered conductive, and thus the input node of inverter circuit 82 is forcefully turned to an H level.

Reduction signal generation circuit 54 further includes PMOS transistors P6 and P7, NMOS transistors N6 and N7 and an inverter circuit 84.

Inverter circuit 84 inverts the I/O reduction mode designating signal REDUCE and supplies the resulting signal as an output.

PMOS transistors P6 and P7 and NMOS transistors N6 and N7 are connected in series between the power supply potential and the ground potential. A gate electrode of PMOS transistor P7 receives an output signal of inverter circuit 84. A gate electrode of NMOS transistor N6 receives the I/O reduction mode designating signal REDUCE. The gate electrodes of PMOS transistor P6 and NMOS transistor N7, each receives the signal RDBN.

When the I/O reduction mode designating signal REDUCE is at an H level, NMOS transistor N6 and PMOS transistor P7 are rendered conductive. Then, in response to the signal RDBN, the signal DATA2 is supplied as an output from a connect node of PMOS transistor P7 and NMOS transistor N6.

When the I/O reduction mode designating signal REDUCE is at an L level, PMOS transistor P7 and NMOS transistor N6 are rendered nonconductive.

Output buffer 42 receives at its input either the signal RDLAT from memory cell peripheral circuitry 50 or the signal DATA2 from reduction signal generation circuit 54 and supplies as an output a corresponding signal to data output buffer 40. Data output buffer 40 transmits a signal corresponding to the input signal to pad 311.

Next, a case in which semiconductor memory device 1000 shown in FIG. 1 has a pipeline processing function will be described.

Herein the pipeline processing function refers to a function capable of continuous multi-bit writing/erasing operation.

Figure 5:
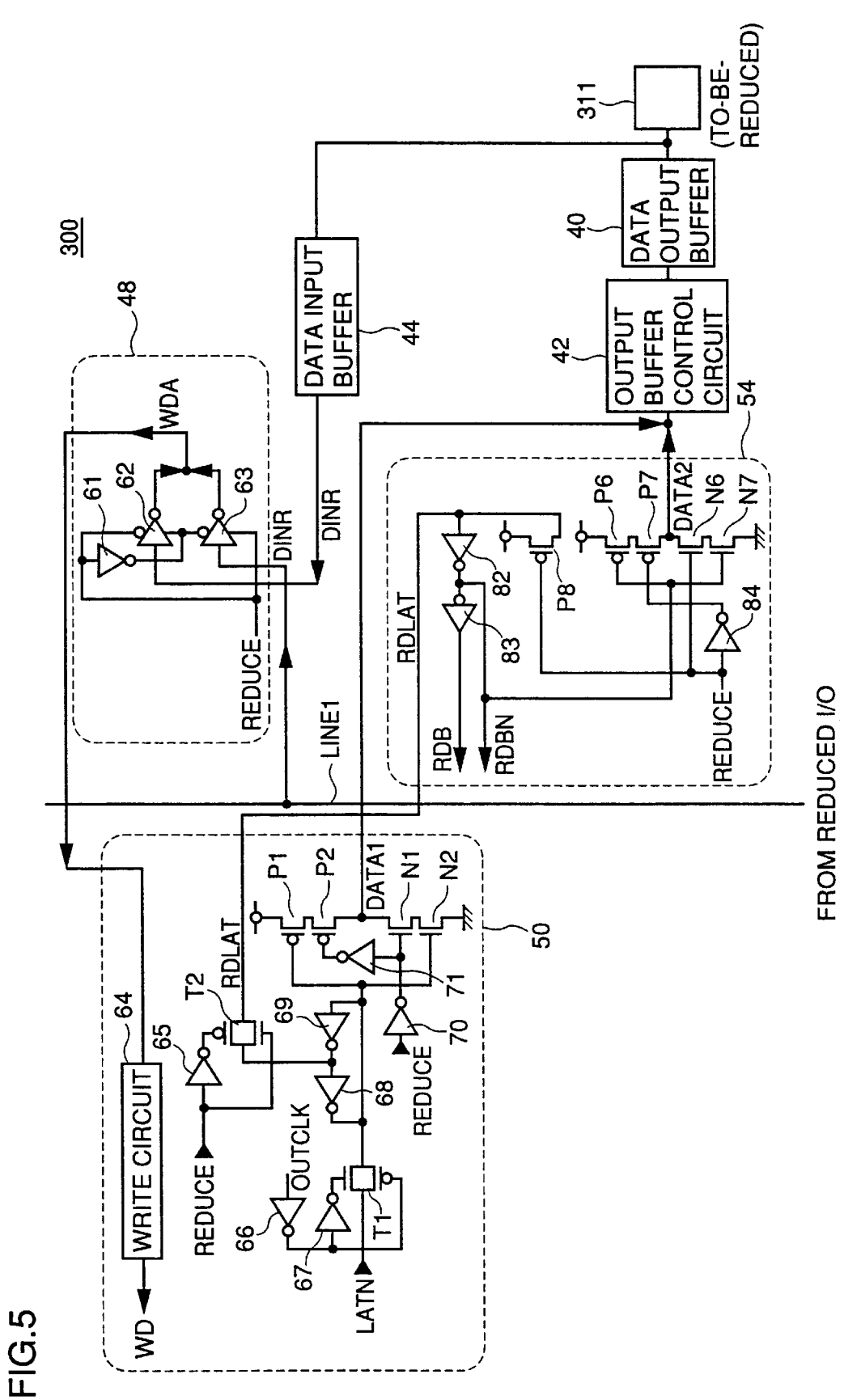
FIG. 5 is a circuit diagram showing an example of a specific configuration of a reduction data input/output circuit corresponding to a to-be-reduced I/O pin in accordance with the first embodiment of the present invention.
Figure 6:
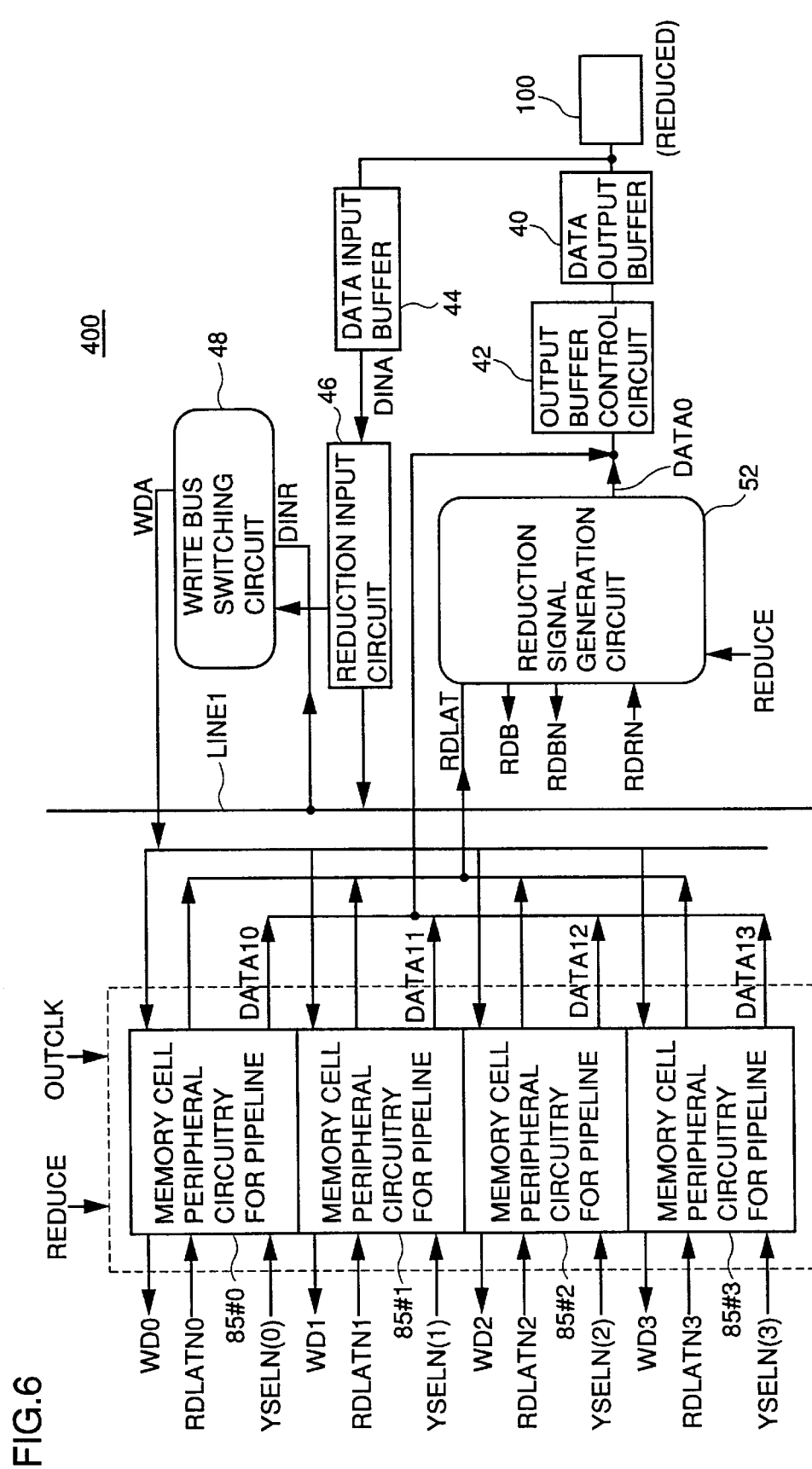
FIG. 6 is a circuit diagram showing an example of a specific configuration of a data input/output circuit 400 corresponding to the reduced I/O pin in the semiconductor memory device having a pipeline processing function in accordance with the first embodiment of the present invention.
Figure 7:
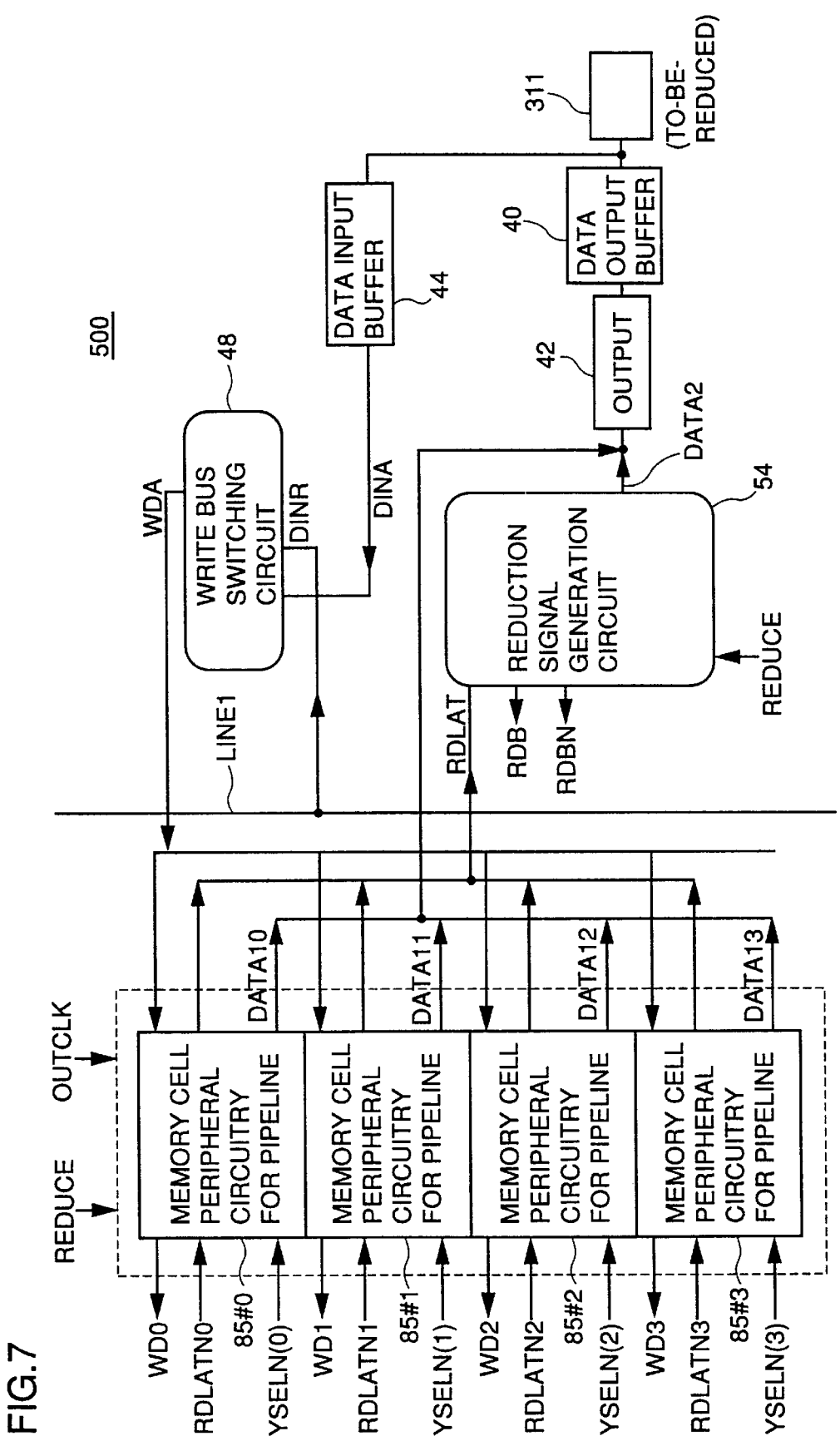
FIG. 7 is a circuit diagram showing an example of a specific configuration of a data input/output circuit 500 corresponding to the to-be-reduced I/O pin in the semiconductor memory device having the pipeline processing function in accordance with the first embodiment of the present invention.

In this example, a data input/output circuit 400 shown in FIG. 6 is used in place of data input/output circuit 200 shown in FIG. 4, and a data input/output circuit 500 shown in FIG. 7 is used in place of data input/output circuit 300 shown in FIG. 5.

FIG. 6 shows one example of a configuration of data input/output circuit 400 corresponding to a reduced I/O pin in a semiconductor memory device having a pipeline processing function, and FIG. 7 shows one example of a configuration of data input/output circuit 500 corresponding to a to-be-reduced I/O pin in the semiconductor memory device having the pipeline processing function. The configuration shown in FIGS. 6 and 7 both deal with a 4-bit continuous writing/reading operation. The same components as those included in data input/output circuits 200 and 300 shown respectively in FIGS. 4 and 5 are designated by the same reference characters and numbers and the description thereof will not be repeated. The memory cell peripheral circuitry is divided into a plurality of blocks in FIGS. 6 and 7 as described below.

Data input/output circuit 400 shown in FIG. 6 includes data output buffer 40, output buffer control circuit 42, data input buffer 44, reduction input circuit 46, write bus switching circuit 48, reduction signal generation circuit 52 and memory cell peripheral circuitry 85#0, 85#1, 85#2 and 85#3 for pipeline processing.

Data input/output circuit 500 shown in FIG. 7 includes data output buffer 40, output buffer control circuit 42, data input buffer 44, write bus switching circuit 48, reduction signal generation circuit 54 and memory cell peripheral circuitry 85#0, 85#1, 85#2 and 85#3 for pipeline processing.

Memory cell peripheral circuitry 85#0–85#3 for pipeline processing will be described. Each one of memory cell peripheral circuitry 85#0–85#3 for pipeline processing transmits, in response to a corresponding Y decode signal (YSELN(0), YSELN(1), YSELN(2) and YSELN(3) in FIGS. 6 and 7), a signal to a memory cell and transmits, in response to a signal read from a memory cell, the signal RDLAT for the I/O reduction mode or a corresponding signal (DATA10, DATA11, DATA12 and DATA13 in FIGS. 6 and 7) for other mode. Herein the Y decode signals YSELN(0)–YSELN(3) are signals for activating a bit line corresponding to a selected memory cell.

Figure 8:
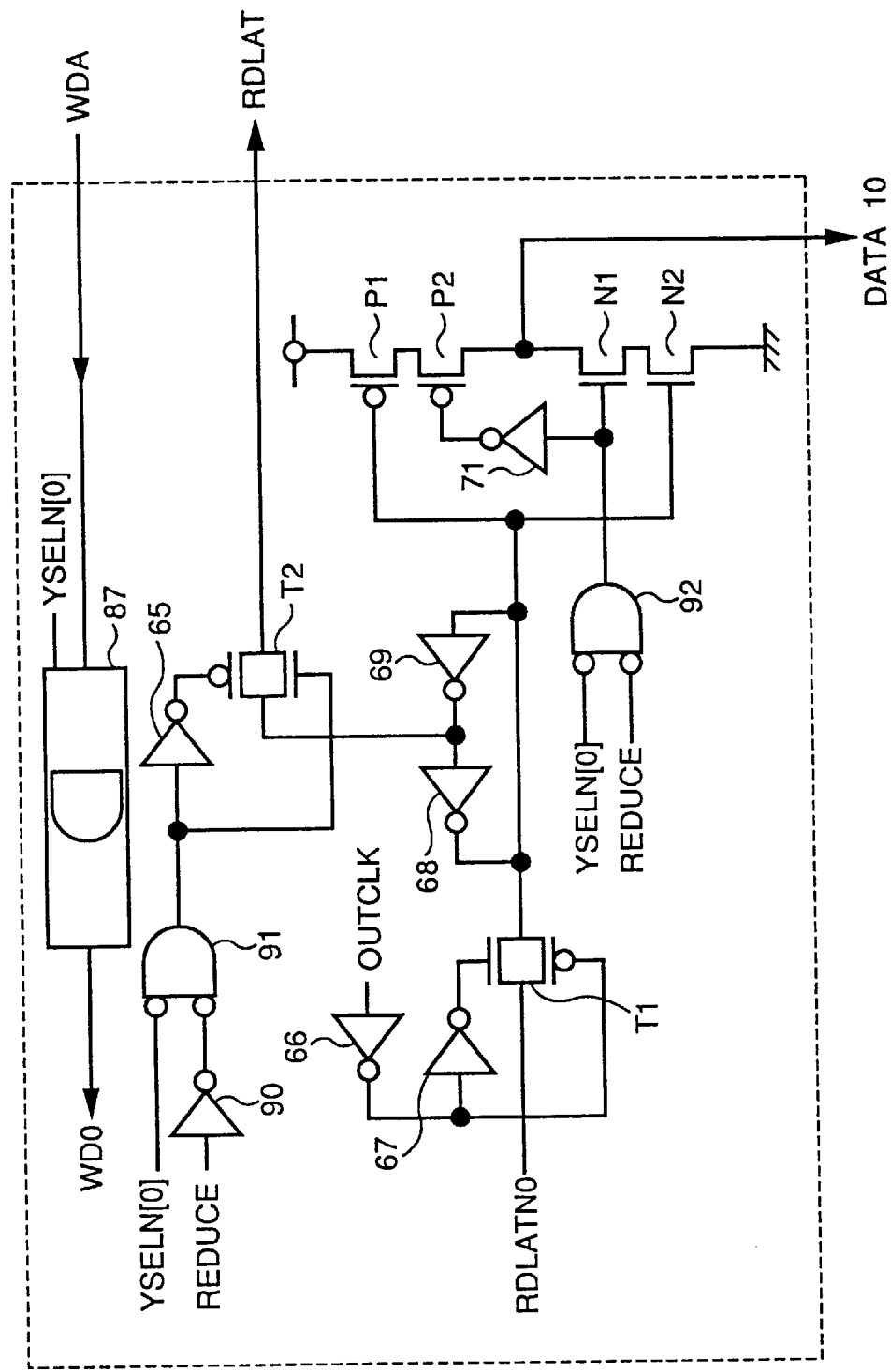
FIG. 8 is a circuit diagram showing an example of a specific configuration of memory cell peripheral circuitry capable of pipeline processing, shown in FIGS. 6 and 7.

With reference to FIG. 8, one example of a specific configuration of the memory cell peripheral circuitry for pipeline processing will be described. The configuration of memory cell peripheral circuitry 85#0 for pipeline processing is shown in FIG. 8 as an example. Other memory cell peripheral circuitry for pipeline processing have the same configuration as that of memory cell peripheral circuitry 85#0 for pipeline processing shown in FIG. 8.

As shown in FIG. 8, memory cell peripheral circuitry 85#0 for pipeline processing includes write circuit 87. Memory cell peripheral circuitry 85#0 for pipeline processing operates in response to the Y decode signal YSELN(0) supplied from a Y decoder, not shown.

Specifically, write circuit 87 provides, in response to the corresponding Y decode signal YSELN(0) and based on the signal WDA supplied from write bus switching circuit 48, a corresponding signal WD0 as an output. Signals corresponding to other memory cell peripheral circuitry for pipeline processing are denoted as signals WD1, WD2 and WD3 in FIGS. 6 and 7. The signal WD0 is transmitted to a corresponding write bus (the write bus WD(0) in FIG. 3).

The signal WD0 is in phase with the signal WDA when the corresponding Y decode signal YSELN(0) is at an active state of an H level. When the corresponding Y decode signal YSELN(0) is at an H level, an output operation stops.

Memory cell peripheral circuitry 85#0 for pipeline processing further includes inverter circuits 65, 66, 67, 68 and 69 and transfer gates T1 and T2. The connections between these elements have been described referring to FIG. 4.

Memory cell peripheral circuitry 85#0 for pipeline processing further includes an inverter circuit 90 and a negative logic NOR circuit 91.

Inverter circuit 90 inverts the I/O reduction mode designating signal REDUCE and supplies as an output the resulting signal. Negative logic NOR circuit 91 receives the corresponding Y decode signal YSELN(0) and the output signal from inverter circuit 90. Negative logic NOR circuit 91 supplies an H level signal when all of the input signals are in an L level state, otherwise supplies an L level signal as an output.

Inverter circuit 65 inverts the output signal from negative logic NOR circuit 91 and supplies as an output the resulting signal. Transfer gate T2 is rendered conductive in response to the output signal from negative logic NOR circuit 91 (and the signal from inverter circuit 65). Because of the conductive state of transfer gate T2, the signal RDLAT opposite in phase with the signal RDLATNO received from a corresponding read bus (the read bus RDLATNO in FIG. 3) is supplied as an output.

Memory cell peripheral circuitry 85#0 for pipeline processing further includes a negative logic NOR circuit 92, an inverter circuit 71, PMOS transistors P1 and P2 and NMOS transistors N1 and N2.

The connections between PMOS transistors P1 and P2 and NMOS transistors N1 and N2 are the same with those described referring to FIG. 4.

Negative logic NOR circuit 92 receives as an input the corresponding Y decode signal YSELN(0) and the I/O reduction mode designating signal REDUCE. When all of the received signals are in an L level state, negative logic NOR circuit 92 supplies as an output an H level signal, and otherwise supplies as an output an L level signal. The output from inverter circuit 71 is an inverted version of the output signal of negative logic NOR circuit 92.

The output signal from negative logic NOR circuit 92 is applied to a gate electrode of NMOS transistor N1. The output signal from inverter circuit 71 is applied to a gate electrode of PMOS transistor P2. A signal DATA10 is supplied as an output from a connect node between PMOS transistor P2 and NMOS transistor N1.

With reference to FIG. 6, in the I/O reduction mode, reduction signal generation circuit 52 receives in time sequence the respective output signal RADLAT from memory cell peripheral circuitry 85#0 for pipeline processing, 85#1, 85#2 and 85#3 and supplies as an output signals RDB and RDBN in sequence. In addition, reduction signal generation circuit 52 receives the signal RDRN from multiplexer 15 shown in FIG. 3 to supply the corresponding output signal DATA0.

In the I/O reduction mode, output buffer control circuit 42 shown in FIG. 6 receives the signal DATA0 from reduction signal generation circuit 52 and in the other mode, receives in time sequence the respective output signals DATA10, DATA11, DATA12 and DATA13 from memory cell peripheral circuitry 85#0, 85#1, 85#2 and 85#3 for pipeline processing.

With reference to FIG. 7, in the I/O reduction mode, reduction signal generation circuit 54 receives in time sequence the respective output signals RDLAT from memory cell peripheral circuitry 85#0 for pipeline processing, 85#1, 85#2 and 85#3 to sequentially supply output signals RDB and RDBN. In addition, reduction signal generation circuit 54 receives the signal RDRN from multiplexer 15 shown in FIG. 3 and supplies the corresponding output signal DATA2.

In the I/O reduction mode, output buffer control circuit 42 shown in FIG. 7 receives the signal DATA2 from reduction signal generation circuit 54, and in the other mode receives in time sequence the respective output signals DATA10, DATA11, DATA12, and DATA13 from memory cell peripheral circuitry 85#0, 85#1, 85#2 and 85#3 for pipeline processing.

Thus, memory cell peripheral circuitry 85#0–85#3 for pipeline processing sequentially transmit a signal to a memory cell in response to a corresponding Y decode signal, respectively. In this case a signal to be written is the output signal WDA from write bus switching circuit 48, which is the output signal DINR from reduction input circuit 46 (or the signal line LINE1) in the I/O reduction mode, and which corresponds to the output signal DINA from data input buffer 44 in the other mode.

In addition, the respective memory cell peripheral circuitry 85#0–85#3 for pipeline processing sequentially supply, in response to the respective signals RDLATN0–RDLATN3 read from memory cells, the signal RDLAT in the I/O reduction mode. These signals are used to determine whether the operation of memory cells are normal or not with respect to the to-be-reduced I/O pin and are signals indicating the result of correctness determination with respect to the reduced I/O pin.

In the other mode, memory cell peripheral circuitry 85#0–85#3 for pipeline processing sequentially supply as outputs, the corresponding signals DATA10, DATA11, DATA12 or DATA13, respectively.

Figure 9:
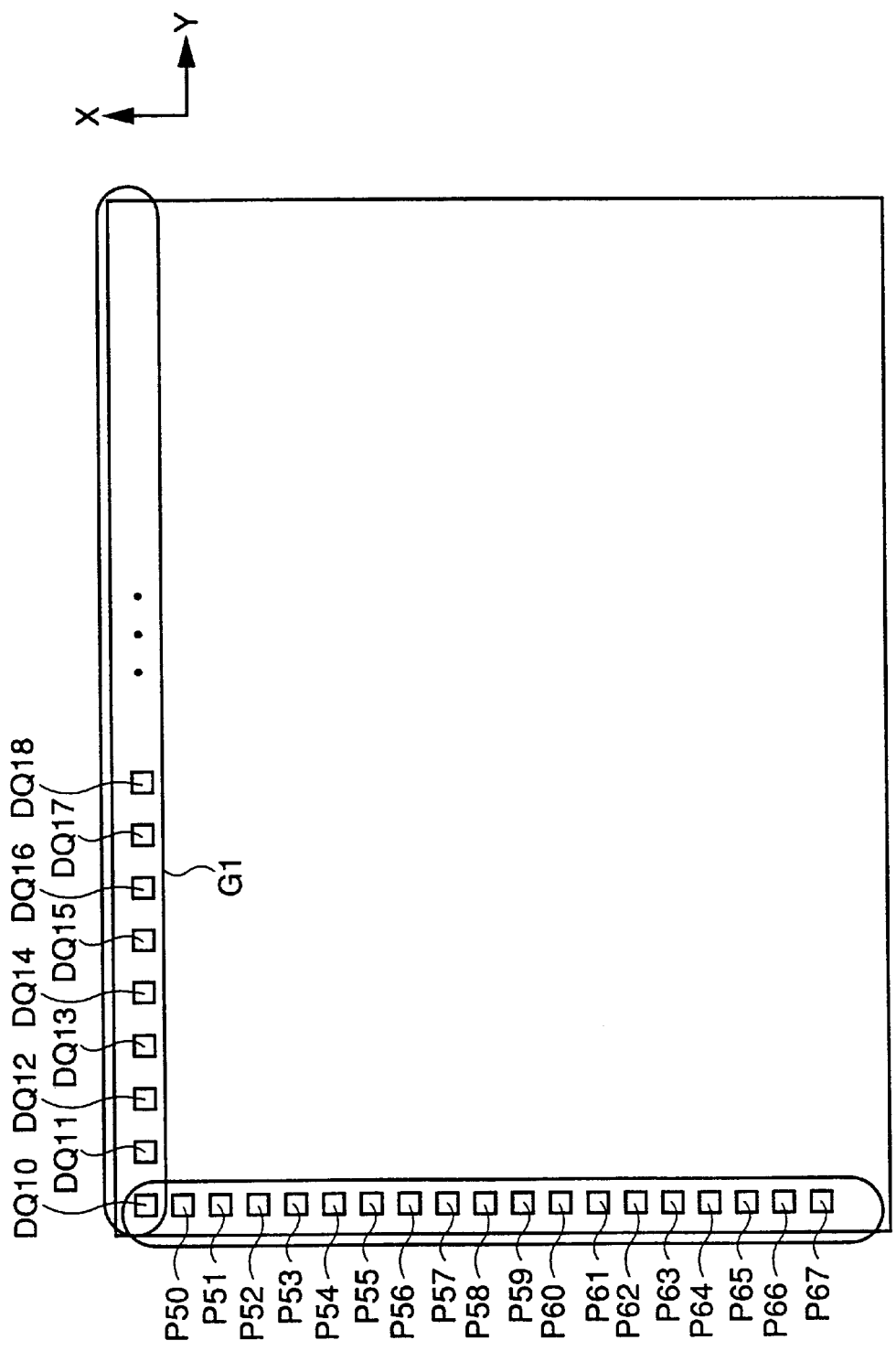
FIG. 9 shows another example of a chip arrangement in the semiconductor memory device in accordance with the first embodiment of the present invention.
Figure 10:
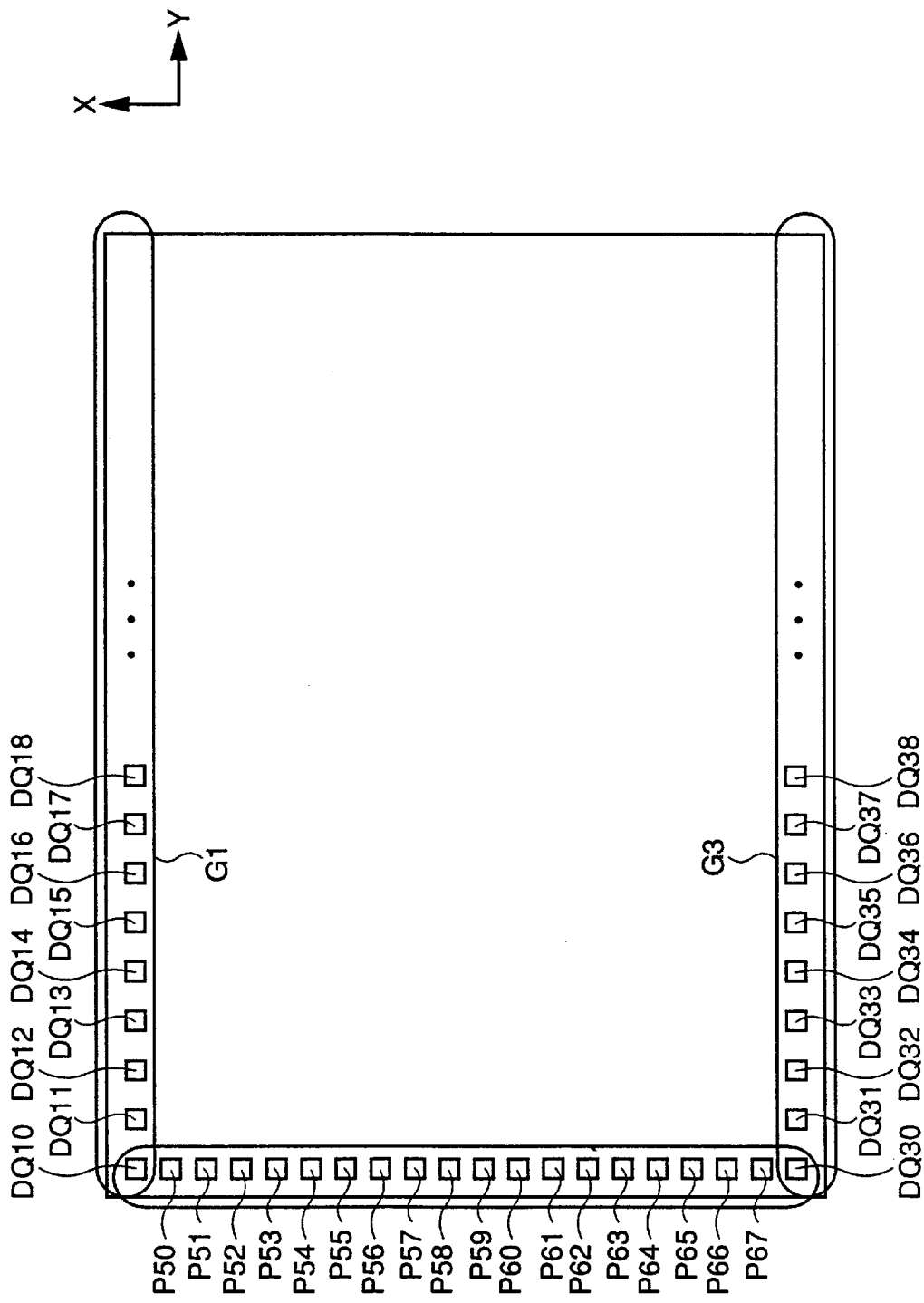
FIG. 10 shows still another example of a chip arrangement in the semiconductor memory device in accordance with the first embodiment of the present invention.
Figure 11:
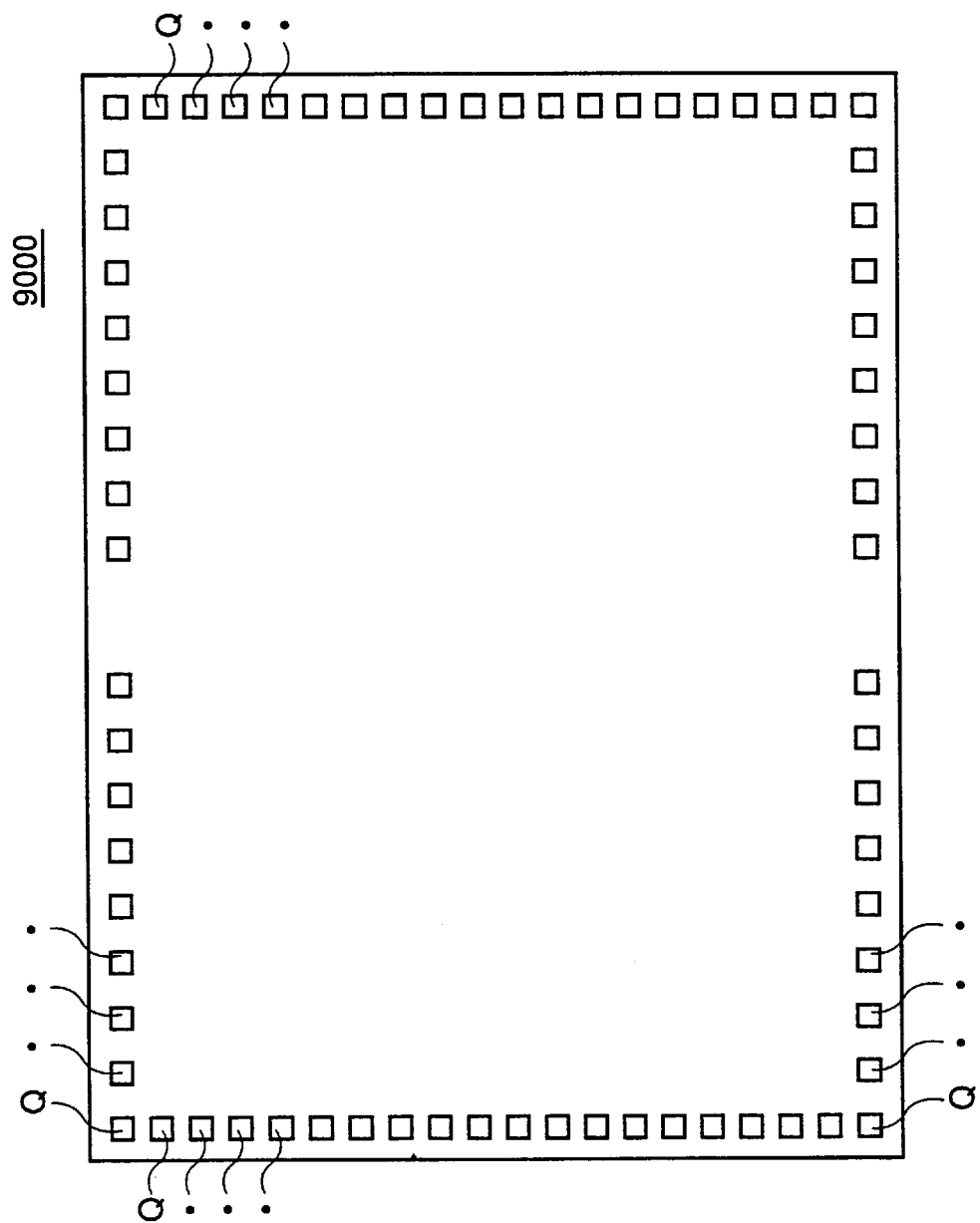
FIG. 11 shows a pin arrangement in a conventional semiconductor memory device.

The arrangement of pins is not limited to that shown in FIG. 1, and may be the arrangement shown in FIGS. 9 or 10. FIGS. 9 and 10 show other examples of a chip arrangement in the semiconductor memory device in accordance with the first embodiment of the present invention.

In FIG. 9, the data input/output pins (e.g. DQ10) included in group G1 are arranged perpendicular to the line of control pins arranged along the short side. In this configuration, the memory cell array test can be conducted by applying a signal only to pins arranged along the X axis (control pins e.g. P50 and reduced I/O pin DQ 10) in the I/O reduction mode.

In FIG. 10, data input/output pins (e.g. DQ10) of group G1 and data input/output pins (e.g. DQ30) of group G3 are respectively arranged perpendicular to the line of control pins arranged along the short side. In this case, again, the memory cell array test can be conducted by applying a signal only to pins arranged along the X axis (control pins e.g. P50 and data input/output pins DQ10 and DQ30 which are reduced I/O pins) in the I/O reduction mode.

Thus in semiconductor memory device 1000 in accordance with the first embodiment of the present invention, the memory cell operation can be tested through the use of lined up pads.

Therefore the test can be conducted without further complexity of a test apparatus. In addition, the test can be performed on a plurality of chips at one time even if those plurality of chips are arranged in line with each other, because an undesirable effect of the test on an adjacent chip can be restricted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of data input/output pins;
    a plurality of memory cells receiving/transmitting a signal from/to respective ones of said plurality of data input/output pins;
    a plurality of control pins receiving a signal for controlling an internal operation;
    test signal generation means for detecting a specific test mode in response to a signal received from said plurality of control pins and for generating a corresponding test signal; and
    test means for testing an operation of said plurality of memory cells, based on said test signal and in response to a signal input from a specific data input/output pin among said plurality of data input/output pins, and for externally supplying a result of said test from said specific data input/output pin; wherein
    said specific data input/output pin is lined up with a line of said plurality of control pins.

2. The semiconductor memory device according to claim 1, wherein said plurality of data input/output pins are divided into a plurality of groups, said plurality of data input/output pins include a plurality of said specific data input/output pins, the plurality of said specific data input/output pins belong to said plurality of groups, respectively, and said test means includes a plurality of test circuits arranged corresponding to the respective ones of said plurality of groups.

3. The semiconductor memory device according to claim 1, wherein said plurality of data input/output pins are divided into a plurality of groups, said plurality of data input/output pins include a plurality of said specific data input/output pins, the plurality of said specific data input/output pins belong to said plurality of groups, respectively, said test means include a plurality of test circuits arranged corresponding to the respective ones of said plurality of groups, and said plurality of control pins are divided into a first group and a second group arranged parallel with each other.

4. The semiconductor memory device according to claim 1, wherein said specific data input/output pin is arranged at an end of the line of said plurality of control pins.

5. The semiconductor memory device according to claim 2, wherein by said division into groups, said plurality of data input/output pins are divided into two groups, and each of said specific data input/output pins of each of groups is arranged at an end of the line of the said plurality of control pins.

6. The semiconductor memory device according to claim 3, wherein by said division into groups, said plurality of data input/output pins are divided into four groups, the respective ones of said specific data input/output pins corresponding to two of said groups are arranged at opposing ends of a line of said plurality of control pins belonging to said first group, and the respective ones of said specific data input/output pins corresponding to the other two of said groups are arranged at opposing ends of a line of said plurality of control pins belonging to said second group.

7. The semiconductor memory device according to claim 1, further comprising:

(1) first input means arranged corresponding to said specific data input/output pin, said first input means transmitting to a selected one of said memory cells, a signal on said specific data input/output pin corresponding thereto, (2) a plurality of second input means arranged corresponding to respective ones of the plurality of data input/output pins other than said specific input/output pin, said plurality of second input means each transmitting to the selected memory cell, in accordance with active/inactive state of said test signal, the signal on said specific data input/output pin or a signal on a corresponding one of said data input/output pins, (3) first output means arranged corresponding to said specific data input/output pin, said first output means including (3-a) first reduction signal generation means responsive to said test signal in an active state, for generating a signal which is to be output to said test means in response to an input signal, and for providing a signal as an output to said specific data input/output pin in response to an output from said test means, and (3-b) first read means for supplying as an output a signal from said selected memory cell to said first reduction signal generation means, in response to said test signal in an active state, and for supplying as an output the signal from said selected memory cell to said specific data input/output pin, in response to said test signal in an inactive state, and (4) a plurality of second output means arranged corresponding to respective one of the plurality of data input/output pins other than said specific data input/output pin, said plurality of second output means each including, (4-a) second reduction signal generation means for supplying as an output the signal from said selected memory cell to said test means, in response to said test signal in an active state, and (4-b) second read means for supplying as an output the signal from said selected memory cell to said second reduction signal generation means, in response to said test signal in an active state, and for supplying as an output the signal from said selected memory cell to said specific data input/output pin, in response to said test signal in an inactive state, and wherein said test means determine match/mismatch of signals received from respective ones of the plurality of said second reduction signal generation means and changes the state of an signal output to said first reduction signal generation means, in accordance with a result of the determination.

8. The semiconductor memory device according to claim 2, further comprising, for each of said groups, (1) first input means arranged for said specific data input/output pin, said first input means transmitting to a selected one of said memory cells, a signal on said specific data input/output pin, (2) a plurality of second input means arranged respectively for the plurality of data input/output pins other than said specific input/output pin, said plurality of second input means each transmitting to the selected memory cell, in accordance with an active/inactive state of said test signal, the signal on said specific data input/output pin or a signal on respective one of said data input/output pins, (3) first output means arranged for said specific data input/output pin, said first output means including, (3-a) first reduction signal generation means, responsive to said test signal in an active state, for generating a signal which is to be output to the corresponding one of said test circuits in response to an input signal, and for providing a signal as an output to said specific data input/output pins in response to an output from the corresponding one of said test circuits, and (3-b) first read means for supplying as an output a signal from said selected memory cell to said first reduction signal generation means, in response to said test signal in an active state, and for supplying as an output the signal from said selected memory cell to said specific data input/output pin, in response to said test signal in an inactive state, and (4) a plurality of second output means arranged respectively for the plurality of data input/output pins, other than said specific data input/output pin, said plurality of second output means each including, (4-a) second reduction signal generation means for supplying as an output the signal from said selected memory cell to the corresponding one of said test circuits, in response to said test signal in an active state, and (4-b) second read means for supplying as an output the signal from said selected memory cell to said second reduction signal generation means corresponding thereto in response to said test signal in an active state, and for supplying as an output the signal from said selected memory cell to said specific data input/output pin, in response to said test signal in an inactive state, and wherein the plurality of said test circuits each determine match/mismatch of signals received from respective ones of plurality of said second reduction signal generation means and change the state of an signal output to the corresponding one of said first reduction signal generation means, in accordance with a result of the determination.

9. The semiconductor memory device according to claim 3, further comprising, for each of said groups, (1) first input means arranged for said specific data input/output pin, said first input means transmitting to a selected one of said memory cells, a signal on said specific data input/output pin, (2) a plurality of second input means arranged respectively for the plurality of data input/output pins other than said specific input/output pin, said plurality of second input means each transmitting to the selected memory cell, in accordance with an active/inactive state of said test signal, the signal on said specific data input/output pin or a signal on respective one of said data input/output pins, (3) first output means arranged for said specific data input/output pin, said first output means including, (3-a) first reduction signal generation means, responsive to said test signal in an active state, for generating a signal which is to be output to the corresponding one of said test circuits in response to an input signal, and for providing a signal as an output to said specific data input/output pins in response to an output from the corresponding one of said test circuits, and (3-b) first read means for supplying as an output a signal from said selected memory cell to said first reduction signal generation means, in response to said test signal in an active state, and for supplying as an output the signal from said selected memory cell to said specific data input/output pin, in response to said test signal in an inactive state, and (4) a plurality of second output means arranged respectively for the plurality of data input/output pins, other than said specific data input/output pin, said plurality of second output means each including, (4-a) second reduction signal generation means for supplying as an output the signal from said selected memory cell to the corresponding one of said test circuits, in response to said test signal in an active state, and (4-b) second read means for supplying as an output the signal from said selected memory cell to said second reduction signal generation means corresponding thereto in response to said test signal in an active state, and for supplying as an output the signal from said selected memory cell to said specific data input/output pin, in response to said test signal in an inactive state, and wherein the plurality of said test circuits each determine match/mismatch of signals received from respective ones of plurality of said second reduction signal generation means and change the state of an signal output to the corresponding one of said first reduction signal generation means, in accordance with a result of the determination.

10. The semiconductor memory device according to claim 7, wherein said test means includes determination means for determining match/mismatch of signals received from respective ones of the plurality of said second reduction signal generation means, and output means for supplying to said first reduction signal generation means, a signal in phase with a signal received by said first output means from said selected memory cell, or a signal opposite in phase with a signal received by said first output means from said selected memory cell, in accordance with the result of said determination.

11. The semiconductor memory device according to claim 8, wherein the plurality of said test circuits each include, determination means for determining match/mismatch of signals received from respective ones of the plurality of said second reduction signal generation means corresponding thereto, and output means for supplying to said first reduction signal generation means corresponding thereto, a signal in phase with a signal received by said first output means corresponding thereto from said selected memory cell, or a signal opposite in phase with a signal received by said first output means corresponding thereto from said selected memory cell, in accordance with the result of said determination.

12. The semiconductor memory device according to claim 9, wherein the plurality of said test circuits each include, determination means for determining match/mismatch of signals received from respective ones of the plurality of said second reduction signal generation means corresponding thereto, and output means for supplying to said first reduction signal generation means corresponding thereto, a signal in phase with a signal received by said first output means corresponding thereto from said selected memory cell, or a signal opposite in phase with a signal received by said first output means corresponding thereto from said selected memory cell, in accordance with the result of said determination.

13. The semiconductor memory device according to claim 7, further comprising;

means for generating a control clock having a pulse train, and address generation means for continuously generating a prescribed number of address signals designating addresses of said memory cells, wherein said first input means is divided into said prescribed number of first blocks, said second input means is divided into said prescribed number of second blocks, said first output means is divided into said prescribed number of third blocks, said second output means is divided into said prescribed number of fourth blocks, wherein said first blocks are sequentially activated in response to each of said prescribed number of address signals, said second blocks are sequentially activated in response to each of said prescribed number of address signals, said third blocks are sequentially activated in response to each of said prescribed number of address signals and said control clock, and, said fourth blocks are sequentially activated in response to each of said prescribed number of address signals and said control clock.

14. The semiconductor memory device according to claim 8, further comprising, means for generating a control clock having a pulse train, and address generation means for continuously generating a prescribed number of address signals designating addresses of said memory cells, wherein said first input means is divided into said prescribed number of first blocks, said second input means is divided into said prescribed number of second blocks, said first output means is divided into said prescribed number of third blocks, said second output means is divided into said prescribed number of fourth blocks, wherein said first blocks are sequentially activated in response to each of said prescribed number of address signals, said second blocks are sequentially activated in response to each of said prescribed number of address signals, said third blocks are sequentially activated in response to each of said prescribed number of address signals and said control clock, and said fourth blocks are sequentially activated in response to each of said prescribed number of address signals and said control clock.

15. The semiconductor memory device according to claim 9, further comprising, means for generating a control clock having a pulse train, and address generation means for continuously generating a prescribed number of address signals designating addresses of said memory cells, wherein said first input means is divided into said prescribed number of first blocks, said second input means is divided into said prescribed number of second blocks, said first output means is divided into said prescribed number of third blocks, said second output means is divided into said prescribed number of fourth blocks, wherein said first blocks are sequentially activated in response to each of said prescribed number of address signals, said second blocks are sequentially activated in response to each of said prescribed number of address signals, said third blocks are sequentially activated in response to each of said prescribed number of address signals and said control clock, and said fourth blocks are sequentially activated in response to each of said prescribed number of address signals and said control clock.

* * * * *